US012568726B2

(12) United States Patent
Huang et al.

(10) Patent No.: US 12,568,726 B2
(45) Date of Patent: Mar. 3, 2026

(54) ELECTRONIC DEVICE HAVING LIGHT-EMITTING DIODE DISPLAY MODULES CONFIGURED FOR REDUCING GAP SIZES AT SPLICES OF MODULES

(71) Applicant: Innolux Corporation, Miao-Li County (TW)

(72) Inventors: Wan-Ling Huang, Miao-Li County (TW); Chun-Hsien Lin, Miao-Li County (TW); Tsau-Hua Hsieh, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 570 days.

(21) Appl. No.: 17/575,643

(22) Filed: Jan. 14, 2022

(65) Prior Publication Data

US 2022/0262847 A1     Aug. 18, 2022

Related U.S. Application Data

(60) Provisional application No. 63/150,089, filed on Feb. 17, 2021.

(30) Foreign Application Priority Data

Oct. 19, 2021     (CN) .......................... 202111217622.6

(51) Int. Cl.
*H10H 29/14*          (2025.01)
*H10H 20/857*          (2025.01)

(52) U.S. Cl.
CPC ........ *H10H 29/142* (2025.01); *H10H 20/857* (2025.01)

(58) Field of Classification Search
CPC ....... H01L 27/156; H01L 33/62; H10K 59/18; H10H 29/142; H10H 20/857
See application file for complete search history.

(56) References Cited

U.S. PATENT DOCUMENTS

2005/0017268 A1* 1/2005 Tsukamoto ............ H10K 59/18
                                                      257/200
2017/0286044 A1* 10/2017 Kim ..................... G09G 3/3607
                        (Continued)

FOREIGN PATENT DOCUMENTS

CN          104851892          8/2015
CN          111200914          5/2020
                  (Continued)

OTHER PUBLICATIONS

"Search Report of Europe Counterpart Application", issued on Jul. 5, 2022, p. 1-p. 8.
                        (Continued)

*Primary Examiner* — Jessica S Manno
*Assistant Examiner* — Andrew Chung
(74) *Attorney, Agent, or Firm* — JCIPRNET

(57)          ABSTRACT

An electronic device includes multiple light-emitting boards, a second circuit board, a control board, and multiple conductive members. Each light-emitting board includes a first circuit board and multiple light-emitting elements. Multiple light-emitting elements are disposed on the first circuit board and are electrically connected to the first circuit board. Multiple light-emitting boards are disposed on the second circuit board and are electrically connected to the second circuit board. The control board is disposed on the second circuit board. Multiple conductive members are disposed on at least one side of the second circuit board. The control board is electrically connected to the second circuit board through multiple conductive members.

16 Claims, 16 Drawing Sheets

1

(56)         References Cited

U.S. PATENT DOCUMENTS

2020/0111391 A1    4/2020  Chao et al.
2021/0267062 A1*   8/2021  Huang .................... H10K 59/18
2023/0290918 A1*   9/2023  Lee ...................... H10K 77/111

FOREIGN PATENT DOCUMENTS

CN         111261639        6/2020
EP         3680932          7/2020

OTHER PUBLICATIONS

"Office Action of China Counterpart Application", issued on Nov. 28, 2025, p. 1-p. 6.

* cited by examiner

ELECTRONIC DEVICE HAVING LIGHT-EMITTING DIODE DISPLAY MODULES CONFIGURED FOR REDUCING GAP SIZES AT SPLICES OF MODULES

CROSS-REFERENCE TO RELATED APPLICATION

This application claims the priority benefits of U.S. provisional application Ser. No. 63/150,089, filed on Feb. 17, 2021, and Chinese application serial no. 202111217622.6, filed on Oct. 19, 2021. The entirety of each of the above-mentioned patent applications is hereby incorporated by reference herein and made a part of this specification.

BACKGROUND

Technical Field

The disclosure relates to an electronic device.

Description of Related Art

Light-emitting diode display modules are designed to have a fixed size. By splicing multiple light-emitting diode display modules together, a large size display can be formed. Deviations in the splicing and the process associated with the module size affect the gap size at the module splice. When the resolution is increased, the visual seamlessness of the module edges is a big challenge.

SUMMARY

The disclosure provides an electronic device, which helps to reduce gap sizes at splices of modules.

According to embodiments of the disclosure, the electronic device includes multiple light-emitting boards, a second circuit board, a control board, and multiple conductive members. Each of the light-emitting boards includes a first circuit board and multiple light-emitting elements. Multiple light-emitting elements are disposed on the first circuit board and are electrically connected to the first circuit board. Multiple light-emitting boards are disposed on the second circuit board and are electrically connected to the second circuit board. The control board is disposed on the second circuit board. Multiple conductive members disposed on at least one side of the second circuit board. The control board is electrically connected to the second circuit board through multiple conductive members.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
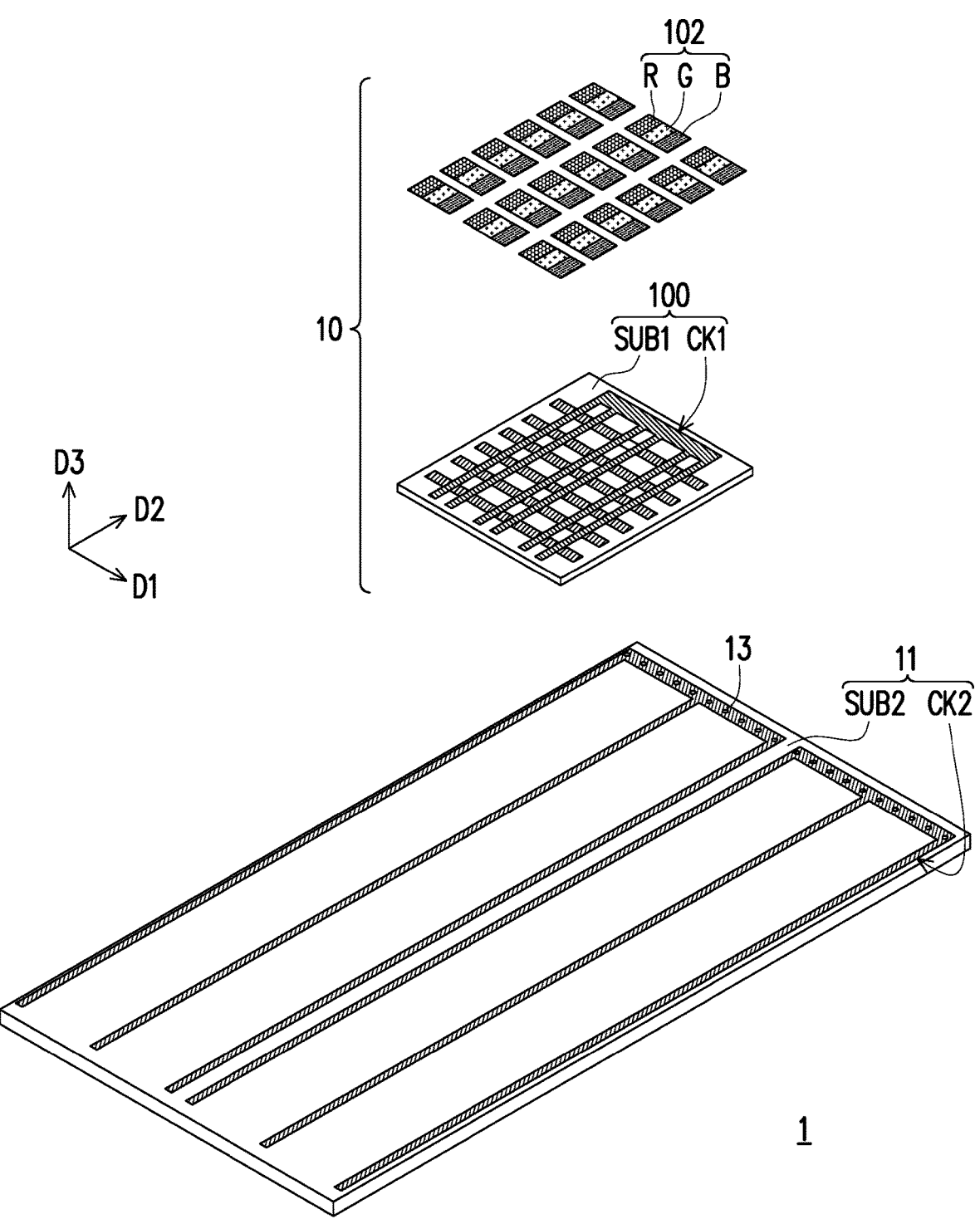
FIG. 1 is an exploded schematic view of an electronic device before splicing according to some embodiments of the disclosure.

The disclosure can be understood by referring to the following detailed description together with the accompanying drawings. It should be noted that in order to make it easy for the reader to understand and to keep the drawings simple, only a portion of the electronic device/display is shown in several drawings in this disclosure, and specific elements in the drawings are not drawn to actual scale. In addition, the number and dimensions of the elements in the drawings are for illustrative purposes only and are not intended to limit the scope of this disclosure. For example, for the sake of clarity, the relative size, thickness and location of each film layer, region or structure may be reduced or enlarged.

Certain terms are used throughout this disclosure and in the accompanying claims to refer to specific elements. Those skilled in the art should understand that electronic device manufacturers may refer to the same elements by different names. The disclosure does not purport to distinguish between elements that have the same function but different names. In the following description and the claims, terms such as "include" and "comprise" are open-ended, and therefore should be interpreted as "comprise but not limited to . . . ."

The directional terms mentioned in this text, such as "up", "down", "front", "rear", "left", "right" are only references to the directions in the drawings. Therefore, the directional terms used are for illustrative purposes and are not intended to limit this disclosure. It should be noted that when an element or a film layer is referred to as being disposed "on" or "connected to" another element or film layer, the element or the film layer may be directly on or directly connected to the another element or film layer, or there may be an inserted element or film layer between the two (the non-direct case). On the contrary, when an element or a film layer is referred to be "directly on" or "directly connected to" another element or film layer, there is no inserted element or film layer between the two.

In some embodiments of the disclosure, terms such as "joint", "interconnection", etc., unless specifically defined, may refer to two structures in direct contact, or may refer to two structures that are not in direct contact and in which other structures are provided between the two structures. The terms about connecting and joint may also include the case where both structures are movable, or where both structures are fixed. In addition, the terms "electrical connected" and "coupling" include any direct and indirect means of electrical connection.

In the embodiments shown in the drawings of the disclosure, the same or similar elements will use the same or similar reference numerals, and redundant descriptions thereof will be omitted. In addition, the features of different embodiments can be mixed and matched arbitrarily as long as they do not contradict the spirit of the invention or conflict with each other, and simple equivalent changes and modifications made in accordance with this specification or claims are still covered by this disclosure. In addition, the terms "first" and "second" mentioned in this specification or claims are used only to name different elements or to distinguish different embodiments or ranges, and are not used to limit the upper or lower limits on the number of elements, nor to limit the order of manufacture or order of placement of elements.

The electronic device disclosed in the disclosure may include a display device, an antenna device, a sensing device, a light-emitting device, or a splicing device, but not limited thereto. The electronic device may include a bendable or a flexible electronic device. The electronic device may, for example, include a liquid crystal layer or a light emitting diode. The light emitting diode may include, for example, an organic light emitting diode (OLED), a sub-millimeter light emitting diode (mini LED), a micro light emitting diode (micro LED) or a quantum dot light emitting diode (quantum dot LED, may include QLED, QDLED), fluorescence, phosphor, or other suitable materials, or a combination of the above, but not limited thereto. In the following, a display device will be used as an electronic device to illustrate this disclosure, but the disclosure is not limited thereto.

The display device of the disclosure may be a self-luminous display device. The self-luminous display device may include a light emitting diode, a light conversion layer or other suitable materials or a combination of the above, but not limited thereto. The light emitting diode may include, for example, an organic light-emitting diode, a sub-millimeter light-emitting diode, a micro light-emitting diode, or a quantum dot light-emitting diode, but not limited thereto. The light conversion layer may include a wavelength conversion material and/or a light filter material, and the light conversion layer may include, for example, fluorescence, phosphor, quantum dots, other suitable materials, or a combination of the above, but not limited thereto.

Figure 2:
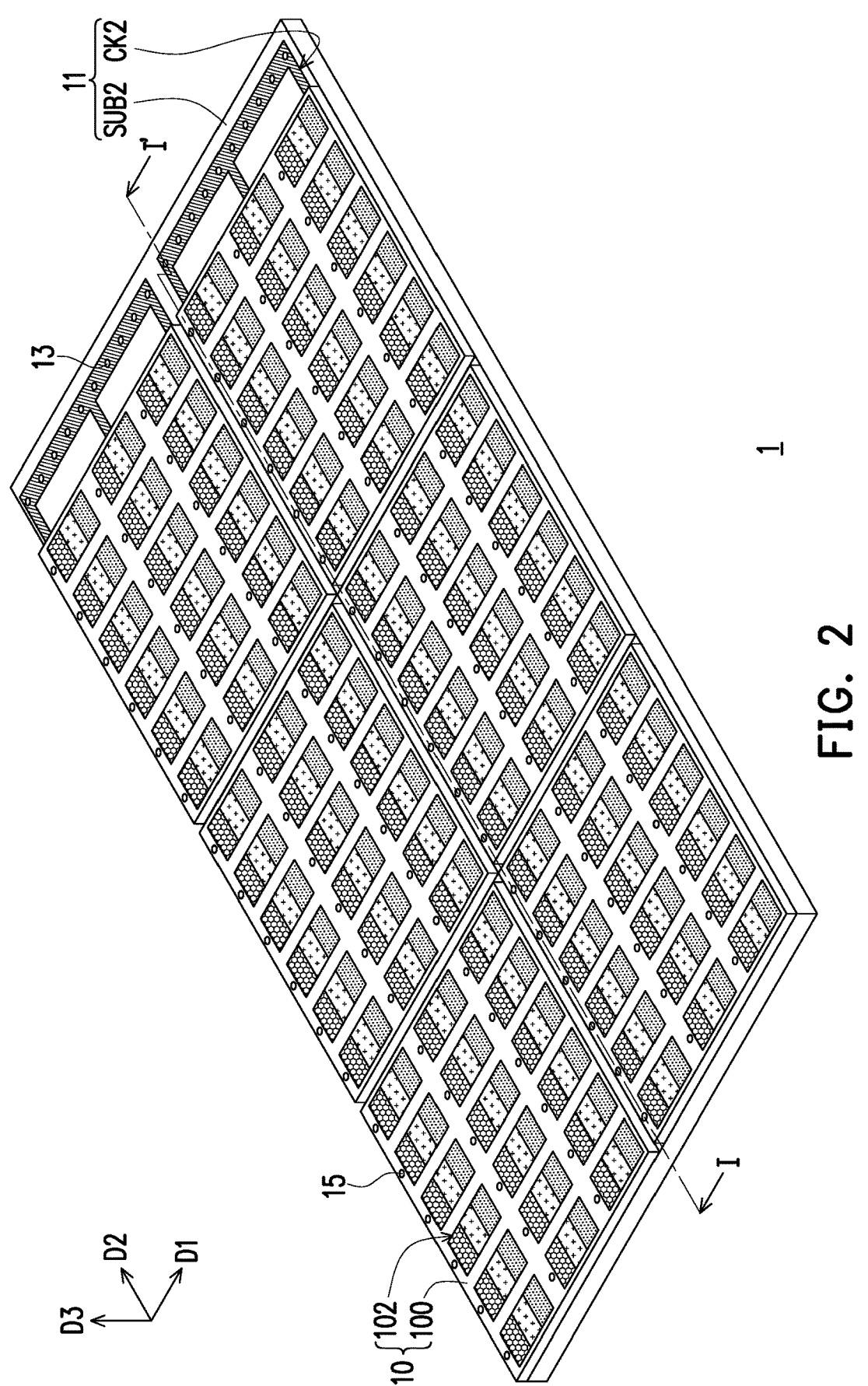
FIG. 2 and FIG. 3 are schematic views of an electronic device from different viewing angles, respectively, according to some embodiments of the disclosure.
Figure 3:
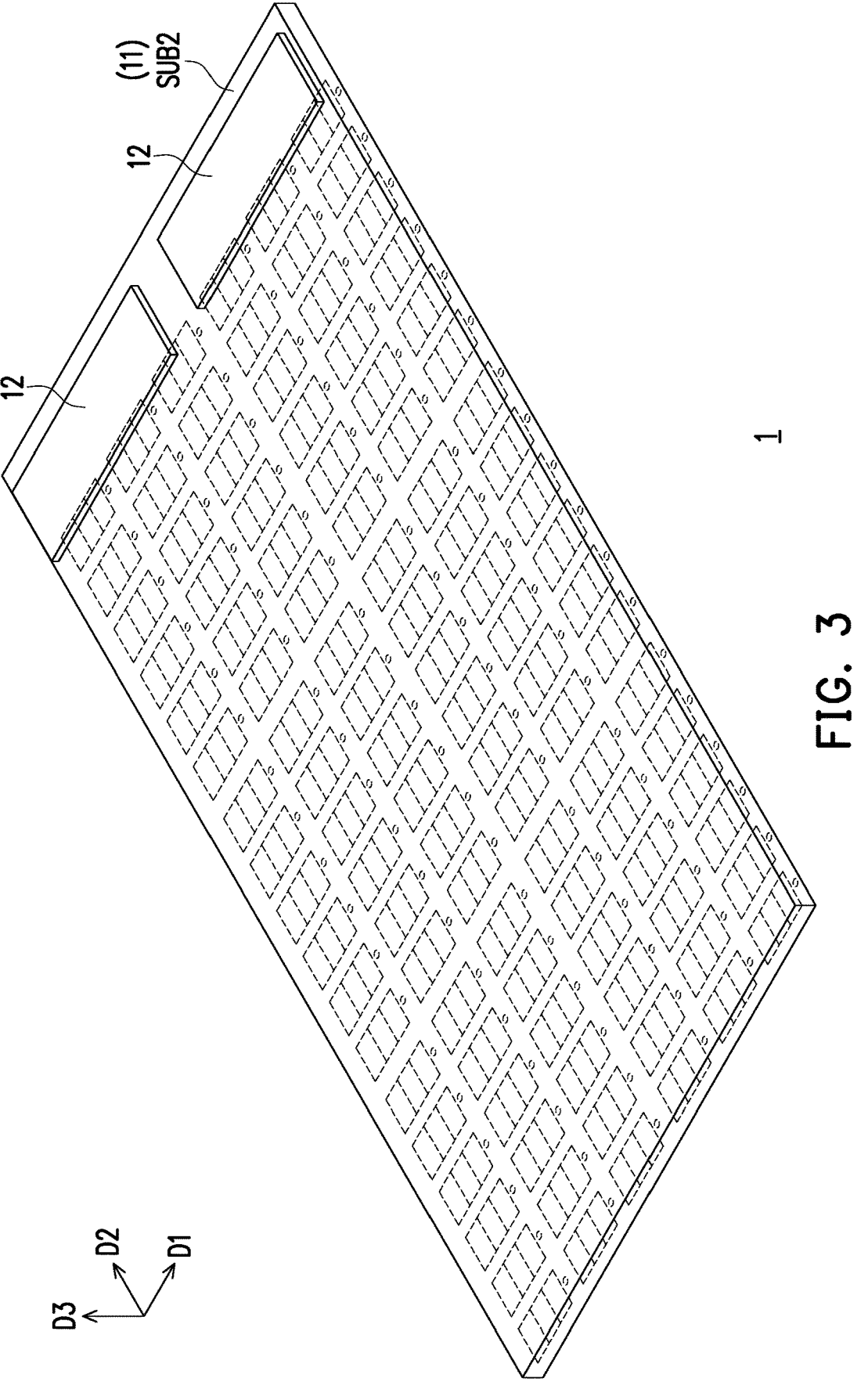
Figure 4:
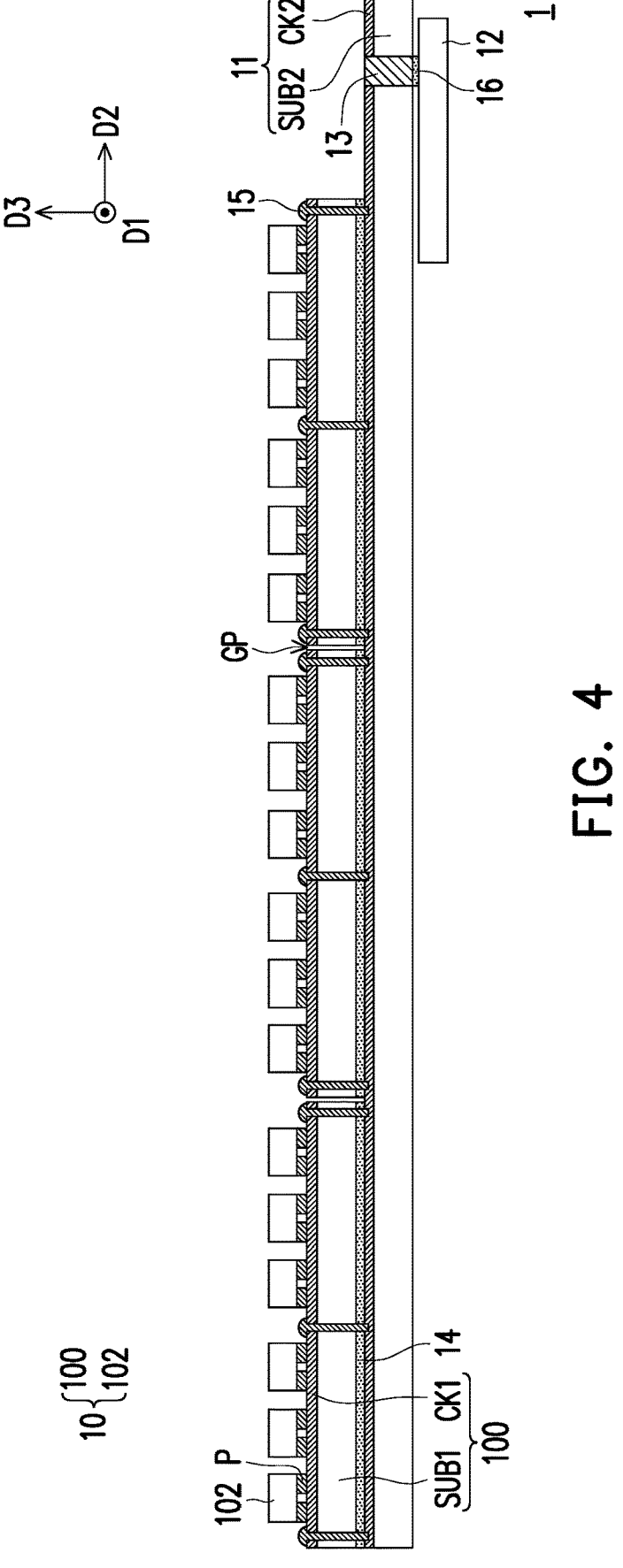
FIG. 4 is a schematic cross-sectional view of FIG. 2 taken along a section line I-I'.

FIG. 1 is an exploded schematic view of an electronic device 1 before splicing according to some embodiments of the disclosure. FIG. 2 and FIG. 3 are schematic views of an electronic device from different viewing angles, respectively, according to some embodiments of the disclosure. FIG. 4 is a schematic cross-sectional view of FIG. 2 taken along a section line I-I'.

Referring to FIG. 1 to FIG. 4, the electronic device 1 may include multiple light-emitting boards 10, a second circuit board 11, a control board 12, and multiple conductive members 13, but not limited thereto. The light-emitting boards 10 may be self-luminous display panels, respectively. For example, each of the light-emitting boards 10 may include a first circuit board 100 and multiple light-emitting elements 102, but not limited thereto.

The first circuit board 100 may include a first substrate SUB1 and a first circuit CK1, but not limited thereto. The first substrate SUB1 may include a rigid substrate or a flexible substrate. For example, a material of the first substrate SUB1 may include glass, polyimide (PI), polyethylene terephthalate (PET), polycarbonate (PC) or a combination of the above, but not limited thereto.

The first circuit CK1 is located between the first substrate SUB1 and the light-emitting elements 102. Although not shown/drawn, the first circuit CK1 may include multiple scan lines, multiple data lines, multiple active devices (e.g., multiple thin film transistors), multiple common electrode lines, multiple power lines, and multiple pads, etc., but not limited thereto.

Multiple light-emitting elements 102 are disposed on the first circuit board 100 and electrically connected to the first circuit board 100. According to some embodiments, as shown in FIG. 4, multiple pads P of each of the light-emitting elements 102 may be connected to the first circuit CK1 through flip chip bonding, so that the light-emitting elements 102 are electrically connected to the first circuit CK1, but not limited thereto.

Multiple light-emitting elements 102 may include multiple light-emitting diodes. The light-emitting diode may include, for example, an organic light-emitting diode, a sub-millimeter light-emitting diode, a micro light-emitting diode, or a quantum dot light-emitting diode, but not limited thereto. According to some embodiments, the light-emitting elements 102 may include multiple red light-emitting elements R, multiple green light-emitting elements G, and multiple blue light-emitting elements B, but not limited thereto. According to some embodiments, the light-emitting elements of different colors (e.g., multiple red light-emitting elements R, multiple green light-emitting elements G, and multiple blue light-emitting elements B) may be alternately arranged in a first direction D1, and the light-emitting elements of same color may can be alternately arranged in a second direction D2. The first direction D1 and the second direction D2 are perpendicular to a thickness direction of the first substrate SUB1 (e.g., a third direction D3), and the first direction D1 and the second direction D2 are, for example, perpendicular to each other, but not limited thereto.

Multiple light-emitting boards 10 are disposed on the second circuit board 11 and are electrically connected to the second circuit board 11. According to some embodiments, as shown in FIG. 4, the electronic device 1 may further include a bonding layer 14, and the light-emitting boards 10 may be disposed on the second circuit board 11 through the bonding layer 14. A material of the bonding layer 14 may include optically clear adhesive (OCA), optically clear resin (OCR), other adhesive materials or other curable materials, but not limited thereto.

According to some embodiments, the second circuit board 11 may include a second substrate SUB2 and a second circuit CK2, but not limited thereto. The second substrate SUB2 may include a rigid substrate or a flexible substrate. For example, a material of the second substrate SUB2 may include glass, polyimide, polyethylene terephthalate, polycarbonate or a combination of the above, but not limited thereto.

The second circuit CK2 is located between the first substrate SUB1 and the second substrate SUB2, and the second circuit CK2 may be disposed on an upper surface of the second substrate SUB2. Although not shown, the second circuit CK2 may include multiple power lines and multiple signal lines, but not limited thereto. According to some embodiments, as shown in FIG. 4, the electronic device 1 may further include multiple conductive pillars 15. The conductive pillars 15 penetrate the first substrate SUB1, and the first circuit CK1 may be electrically connected to the second circuit CK2 through the conductive pillars 15. For example, before or after the light-emitting board 10 is disposed on the second circuit board 11, multiple openings (not shown) exposing the second circuit CK2 may be formed by a drilling process (e.g., laser drilling, etching, or a combination of the above). Each of the openings, for example, penetrates the first circuit CK1, the first substrate SUB1, and the bonding layer 14. Then, a conductive material, such as copper (Cu), silver (Ag), gold (Au), tin (Sn) or other similar materials may be formed in the openings by inkjet, dispensing, deposit, electroplating or chemical plating to form the conductive pillars 15.

The control board 12 is disposed on the second circuit board 11. For example, the control board 12 may be disposed below the second circuit board 11 or a lower surface of the second substrate SUB2, that is, the control board 12 and multiple light-emitting boards 10 may be disposed on different sides of the second circuit board 11. The control board 12 and the second circuit CK2 are respectively disposed on opposite sides of the second substrate SUB2, for example. As shown in FIG. 4, the second circuit CK2 is, for example, disposed on an upper surface side of the second substrate SUB2, and the control board 12 is disposed, for example, on a lower surface side of the second substrate SUB2.

Multiple conductive members 13 penetrate the second circuit board 11, and the control board 12 may be electrically connected to the second circuit board 11 through the conductive members 13. For example, multiple openings (not shown) may be formed in the second circuit board 11 by a drilling process (e.g., laser drilling, etching, or a combination of the above). Then, a conductive material, such as copper, silver, gold, tin or other similar materials may be formed in the openings by inkjet, dispensing, deposit, electroplating or chemical plating to form the conductive members 13. According to some embodiments, the conductive members 13 may be electrically connected to the control board 12 through an anisotropic conductive film 16 or other conductive materials. The conductive members 13 and the conductive pillars 15 may be electrically connected structures, that is, structures that enable two elements to be electrically connected.

According to this embodiment, the second circuit board 11 may be configured to carry multiple light-emitting boards 10 and electrically connect the control board 12 and the light-emitting boards 10. It may be easy to splice by disposing the light-emitting boards 10 on the second circuit board 11 to form a larger size display. In addition, disposing the light-emitting boards 10 adjacent to each other helps to reduce a size of gaps GP between the light-emitting boards 10 to facilitate realization of visually seamless. Furthermore, disposing the control board 12 below the second circuit board 11 helps to reduce a border of the second circuit board 11 to facilitate realization of high resolution or narrow border design. However, according to other embodiments not shown, the control board 12 may also be disposed above the second circuit board 11 or the upper surface of the second substrate SUB2, that is, the control board 12 and the light-emitting boards 10 may be disposed on a same side of the second circuit board 11, so that settings of the conductive members 13 may be omitted.

In FIG. 2, six light-emitting boards 10 arranged in an array are disposed on the second circuit board 11. An area of the second circuit board 11 is slightly larger than a sum of areas of the six light-emitting boards 10, and each of the light-emitting boards 10 includes thirty-six light-emitting elements 102. However, it should be understood that a number or arrangement of the light-emitting boards 10 disposed on the second circuit board 11, the area of the second circuit board 11, or a number or arrangement of the light-emitting elements 102 included in the each of the light-emitting boards 10 may be changed as required.

According to some embodiments, although not shown, the electronic device 1 may include multiple second circuit boards 11 and multiple connectors. Multiple light-emitting boards 10 are disposed on each of the second circuit boards 11. The connectors are disposed on at least two sides of the second circuit boards 11, and the second circuit boards 11 may be spliced together through the connectors to form a larger size display.

Figure 5:
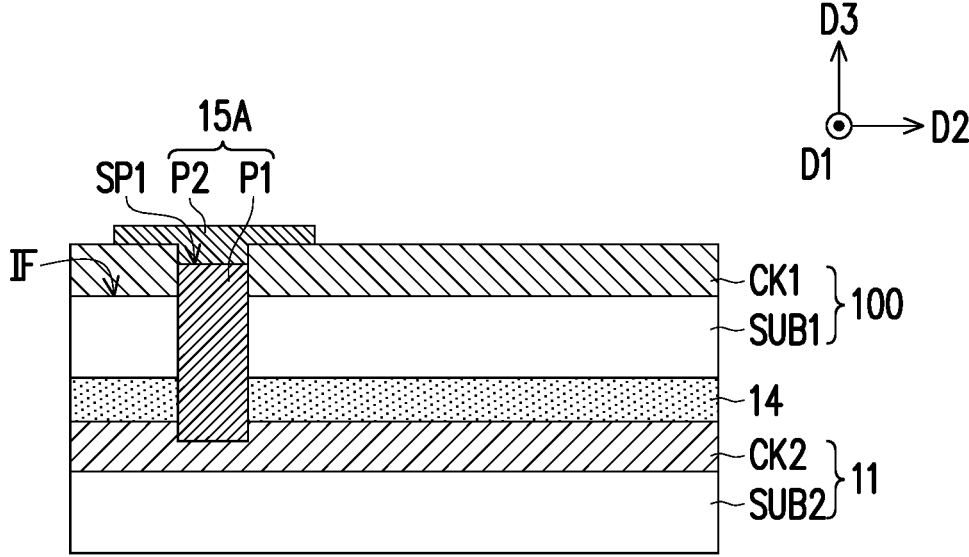
FIG. 5 is a partial schematic cross-sectional view of an electronic device according to some embodiments of the disclosure.

FIG. 5 is a partial schematic cross-sectional view of an electronic device according to some embodiments of the disclosure. According to some embodiments, as shown in FIG. 5, a conductive pillar 15A may include a first part P1 and a second part P2. The first part P1 penetrates the first substrate SUB1, and a top surface SP1 of the first part P1 may be slightly higher or slightly lower than a joint surface IF of the first substrate SUB1 and the first circuit CK1. The second part P2 is disposed on the first circuit CK1 and connected to the first part P1. The first part P1 may be made in a same way as the conductive pillar 15 and therefore will not be repeated in the following. After making the first part P1, a conductive material, such as copper, silver, gold, tin or other similar materials, may be formed on the first part P1 by inkjet, dispensing, deposit, electroplating, or chemical plating to form the second part P2. According to some embodiments, materials of the first part P1 and the second part P2 may be the same or the materials of the first part P1 and the second part P2 may be different, and the disclosure is not limited thereto. According to some embodiments, the conductive pillar 15 may be changed to a design of the conductive pillar 15A, and the disclosure is not limited thereto.

Figure 6:
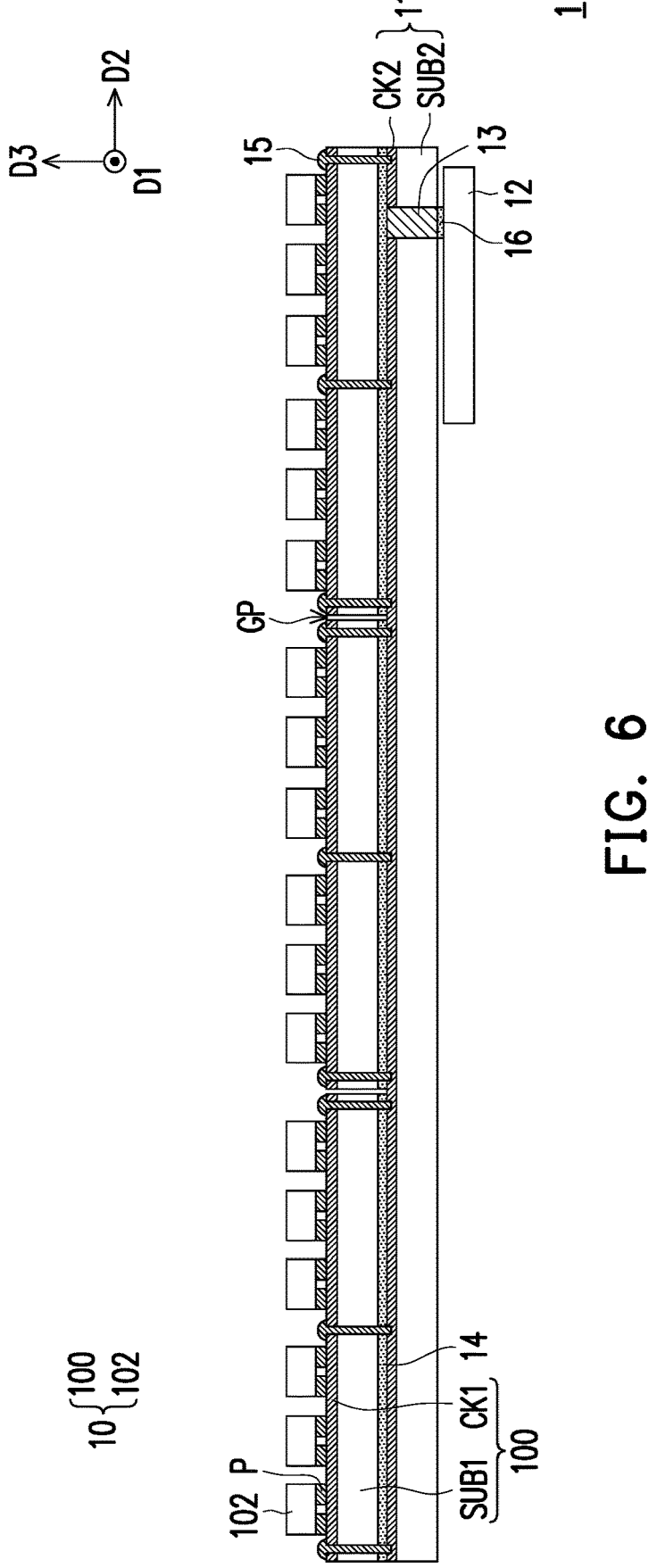
FIG. 6 is another schematic cross-sectional view of FIG. 2 taken along the section line I-I'.

FIG. 6 is another schematic cross-sectional view of FIG. 2 taken along the section line I-I'. According to some embodiments, as shown in FIG. 6, the border of the second circuit board 11 may be reduced by disposing the conductive member 13 below the light-emitting board 10, that is, the conductive member 13 overlaps the light-emitting board 10 in the third direction D3, to facilitate realization of high resolution or narrow border design.

Figure 7:
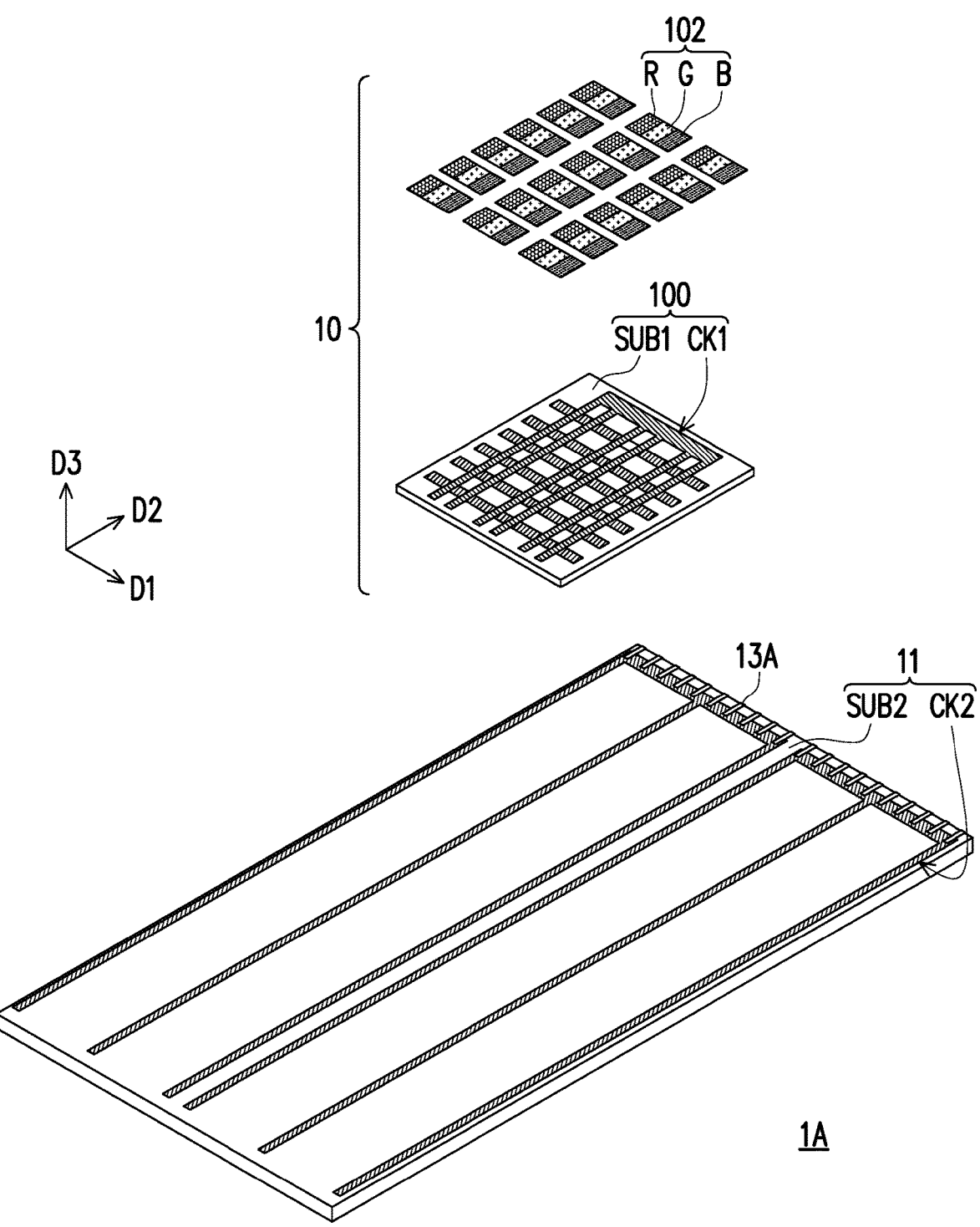
FIG. 7 is an exploded schematic view of an electronic device before splicing according to some embodiments of the disclosure.
Figure 8:
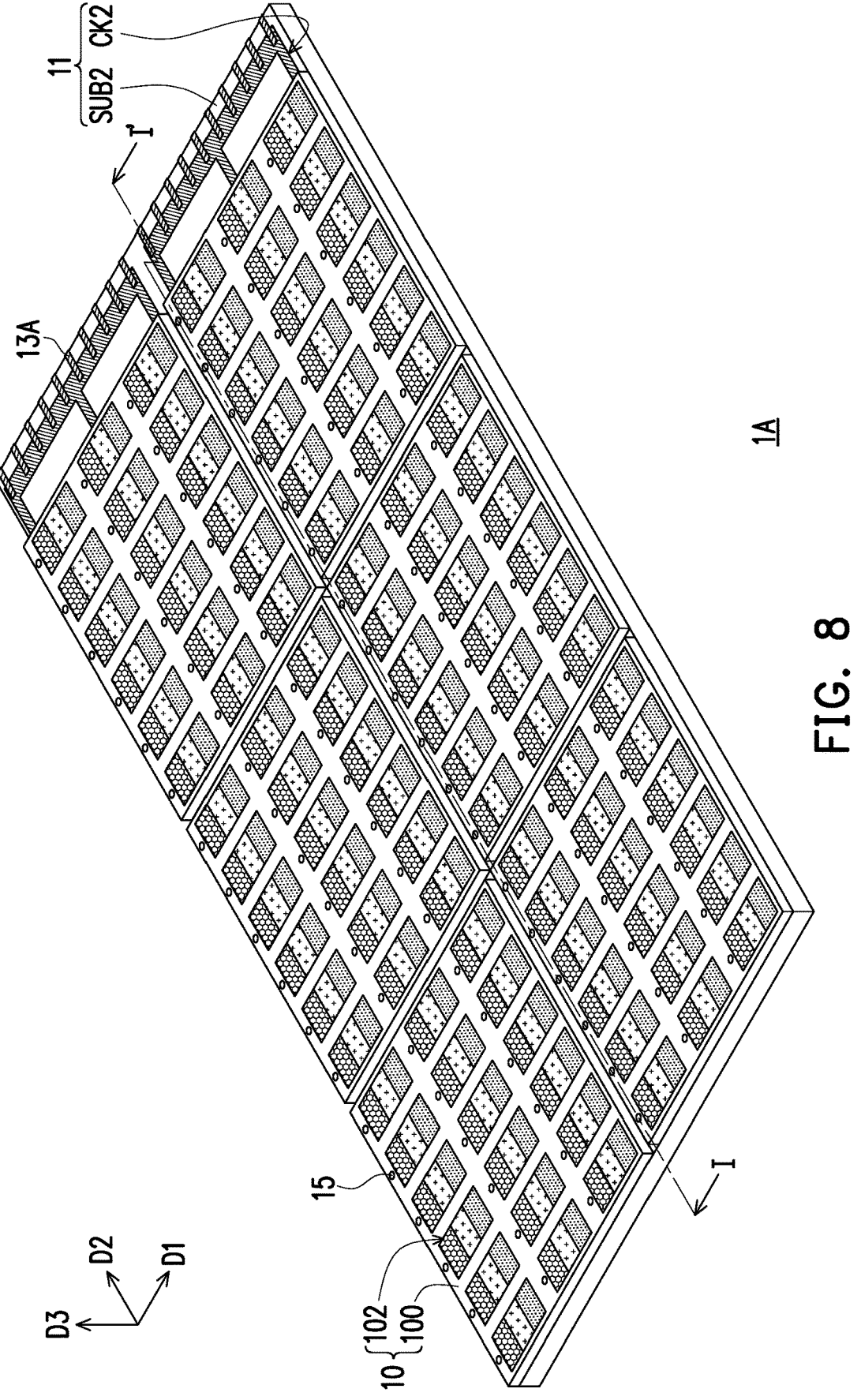
FIG. 8 and FIG. 9 are schematic views of an electronic device from different viewing angles, respectively, according to some embodiments of the disclosure.
Figure 9:
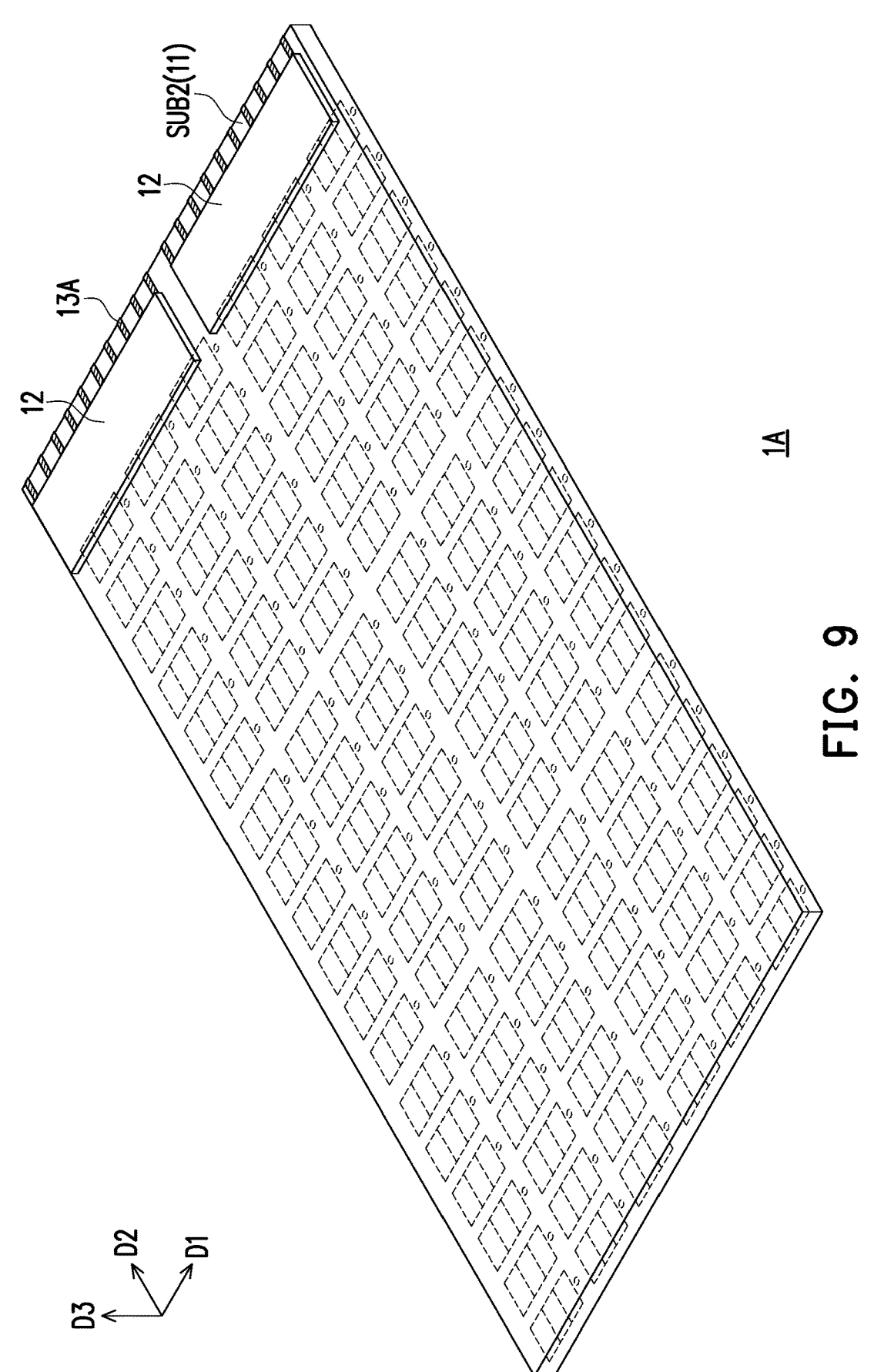
Figure 10:
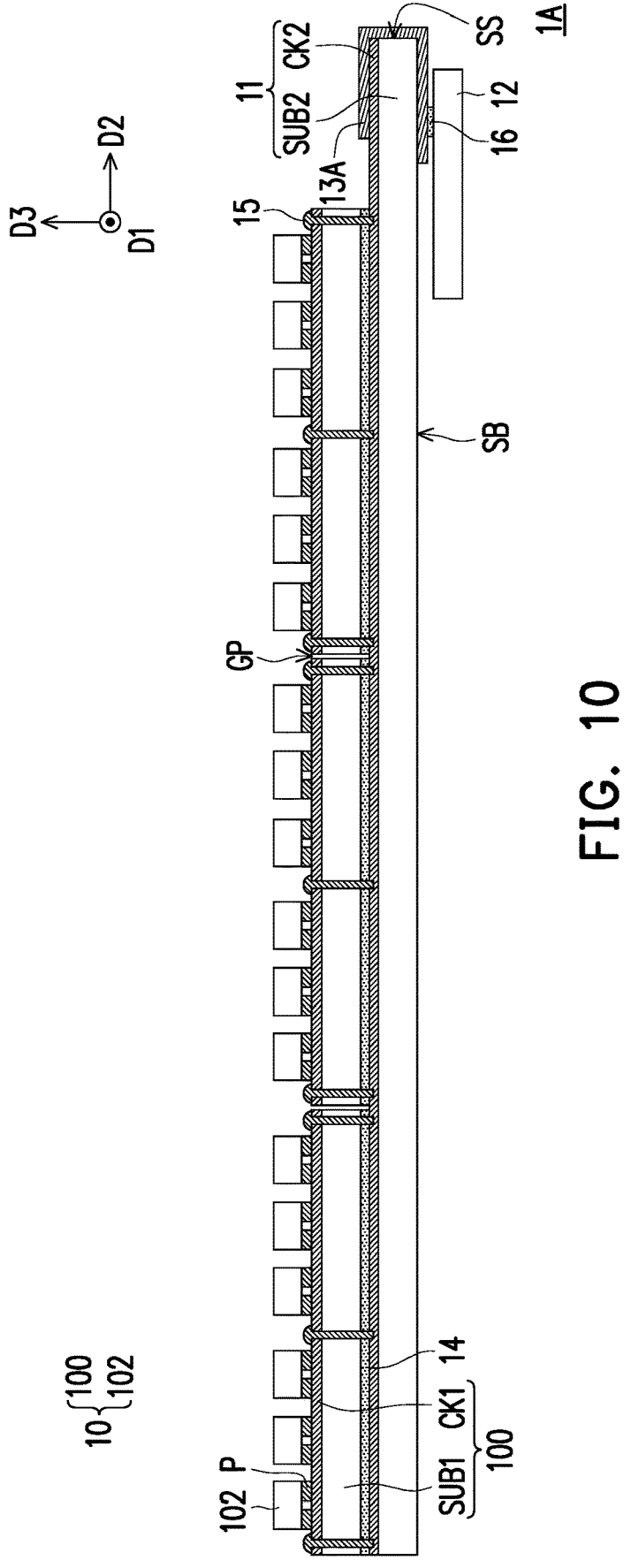
FIG. 10 to FIG. 12 are various schematic cross-sectional views of FIG. 8 taken along the section line I-I'.
Figure 11:
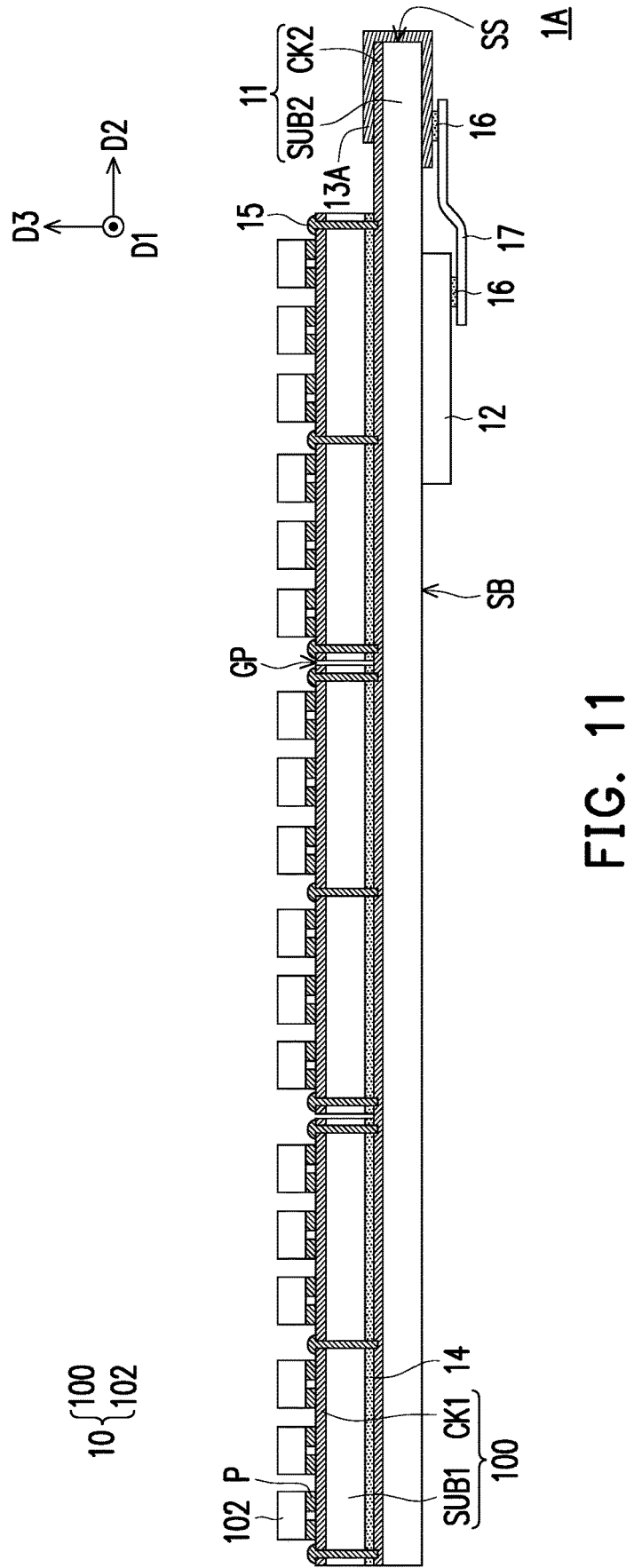
Figure 12:
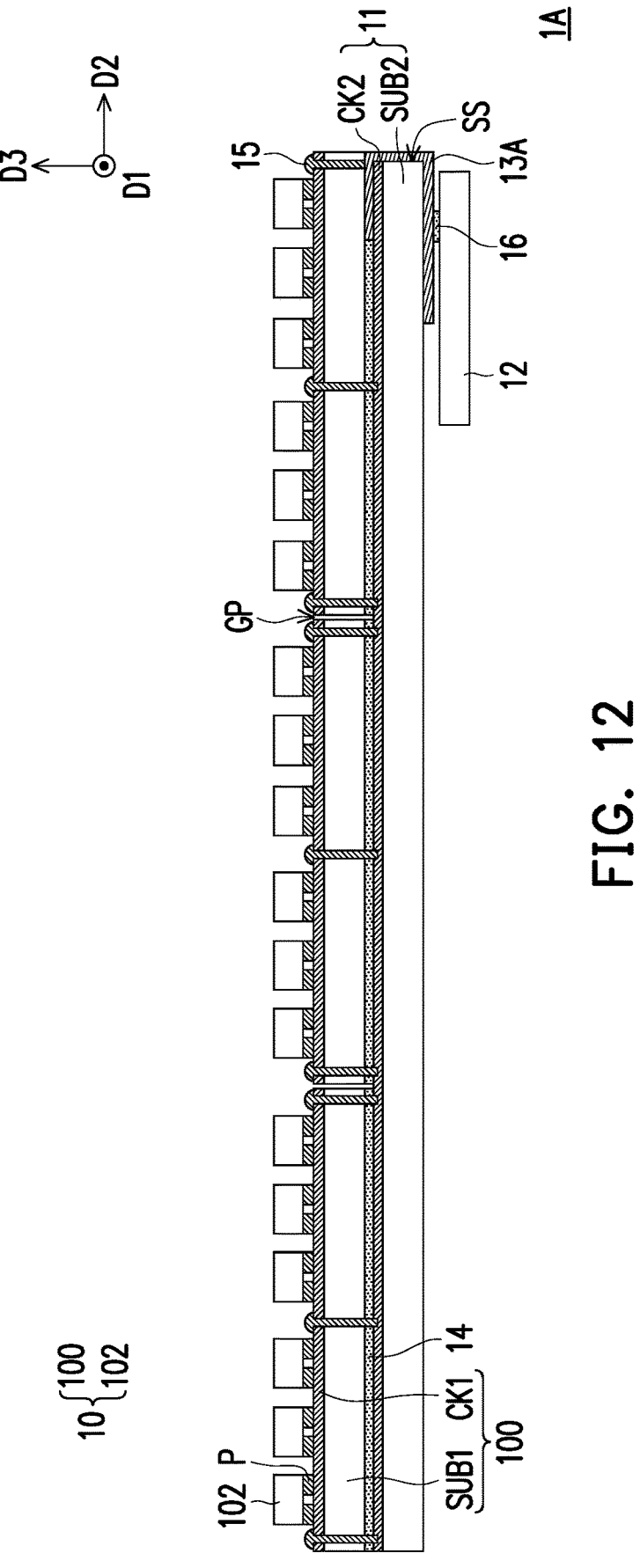

FIG. 7 is an exploded schematic view of an electronic device before splicing according to some embodiments of the disclosure. FIG. 8 and FIG. 9 are schematic views of an electronic device from different viewing angles, respectively, according to some embodiments of the disclosure. FIG. 10 to FIG. 12 are various schematic cross-sectional views of FIG. 8 taken along the section line I-I'.

Referring to FIG. 7 to FIG. 10, main differences between an electronic device 1A and the electronic device 1 shown in FIG. 1 to FIG. 4 are as follows. In the electronic device 1A, multiple conductive members 13A are disposed on at least one side of the second circuit board 11. FIG. 7 to FIG. 10 schematically illustrate the conductive members 13A disposed on a same side (e.g., a short side) of the second circuit board 11, but not limited thereto. According to other embodiments, the conductive members 13A may be disposed on a long side of the second circuit board 11; or, the conductive members 13A may be disposed on opposite sides or adjacent sides, etc., of the second circuit board 11.

According to some embodiments, as shown in FIG. 10, the conductive member 13A is located on a side of the second circuit board 11 and may cover a part of the second circuit CK2. The conductive member 13A may extend from the second circuit CK2 along a side SS of the second substrate SUB2 to a bottom surface SB of the second substrate SUB2. For example, a conductive material (e.g., silver paste, conductive ink containing copper or other conductive particles, or metal) may be formed on the second circuit board 11 by printing or photolithography process, etc., to form the conductive member 13A, but not limit thereto.

The conductive member 13A and the control board 12 may be electrically connected through an anisotropic conductive film, a flexible printed circuit board, or a combination of the above. As shown in FIG. 10, the conductive member 13A may be electrically connected to the control board 12 through the anisotropic conductive film 16. As shown in FIG. 11, the conductive member 13A may be electrically connected to the control board 12 through the anisotropic conductive film 16 and a flexible printed circuit board 17.

According to some embodiments, as shown in FIG. 12, the border of the second circuit board 11 may be reduced by disposing the conductive member 13A below the light-emitting board 10, that is, the conductive member 13A overlaps the light-emitting board 10 in the third direction D3, to facilitate realization of high resolution or narrow border design.

Figure 13:
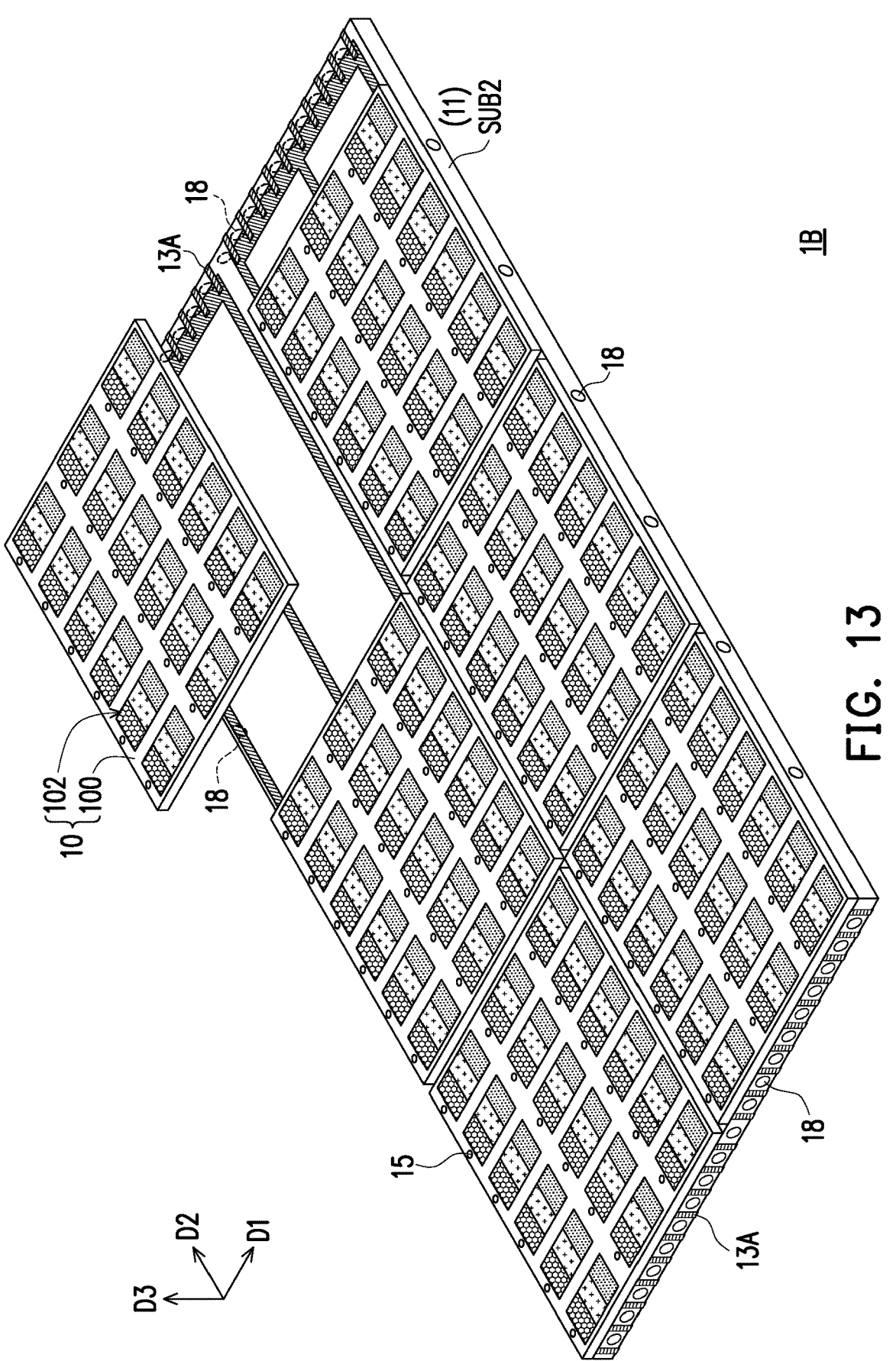
FIG. 13 and FIG. 14 are schematic views of an electronic device during splicing according to some embodiments of the disclosure.
Figure 14:
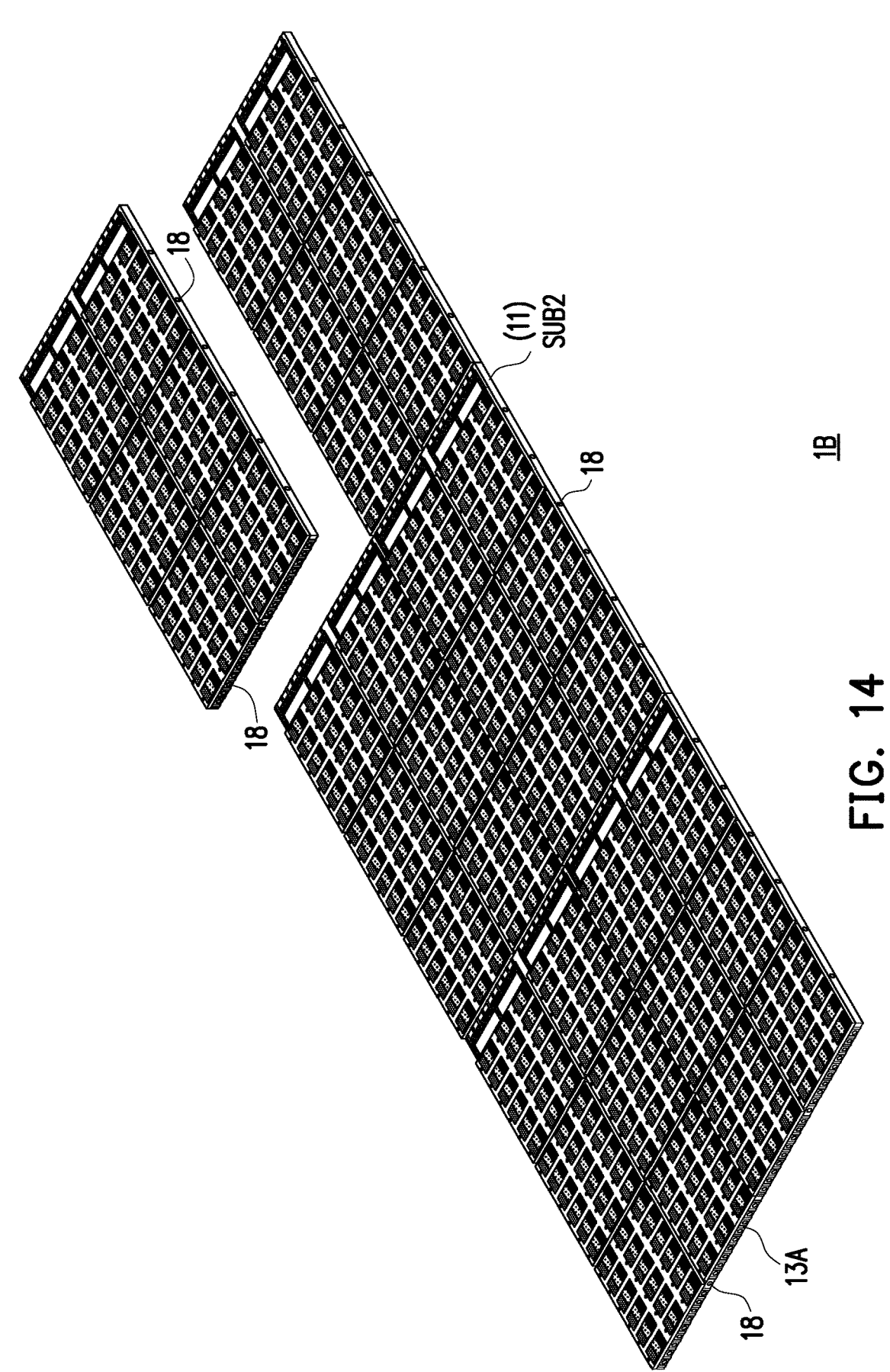

FIG. 13 and FIG. 14 are schematic views of an electronic device during splicing according to some embodiments of the disclosure. Referring to FIG. 13 and FIG. 14, differences between an electronic device 1B and one of the electronic device 1A shown in FIG. 7 to FIG. 12 are as follows. In the electronic device 1B, multiple conductive members 13A are disposed on opposite sides of the second circuit board 11. For example, the conductive members 13A may be disposed on both sides of the second circuit board 11 parallel to the first direction D1, but not limited thereto.

According to some embodiments, as shown in FIG. 13 and FIG. 14, the electronic device 1B may include multiple second circuit boards 11, and the electronic device 1B may further include multiple connectors 18. The connectors 18 are disposed on at least two sides of the second circuit boards 11 (e.g., two sides parallel to the first direction D1, two sides parallel to the second direction D2, all sides). The second circuit boards 11 are spliced together through the connectors 18 to form a larger size display.

According to some embodiments, multiple connectors 18 and multiple conductive members 13A are disposed, for example, alternately on a side of the second circuit board 11 parallel to the first direction D1, and the connectors 18 are disposed at intervals on a side of the second circuit board 11 parallel to the second direction D2, but not limited thereto. According to some embodiments, the connectors 18 may be magnetic bumps. For example, in FIG. 14, the connectors 18 disposed on a left side and an upper side of the each of the second circuit boards 11 may be N poles of magnets, and the connectors 18 disposed on a right side and a lower side of the each of the second circuit boards 11 may be S poles of magnets. In this way, based on that the opposite poles will attract one another, but the like poles will repel one another, a foolproof effect may be provided when aligning. It should be understood that the design of the N poles and the S poles may be changed according to different needs, and not limited thereto.

According to some embodiments, although not shown, multiple second circuit boards 11 spliced together may be supported by a metal bracket; alternatively, the second circuit boards 11 may be supported by a larger carrier board, and an area of the carrier board, for example, is greater than or equal to a sum of areas of the second circuit boards 11.

Figure 15:
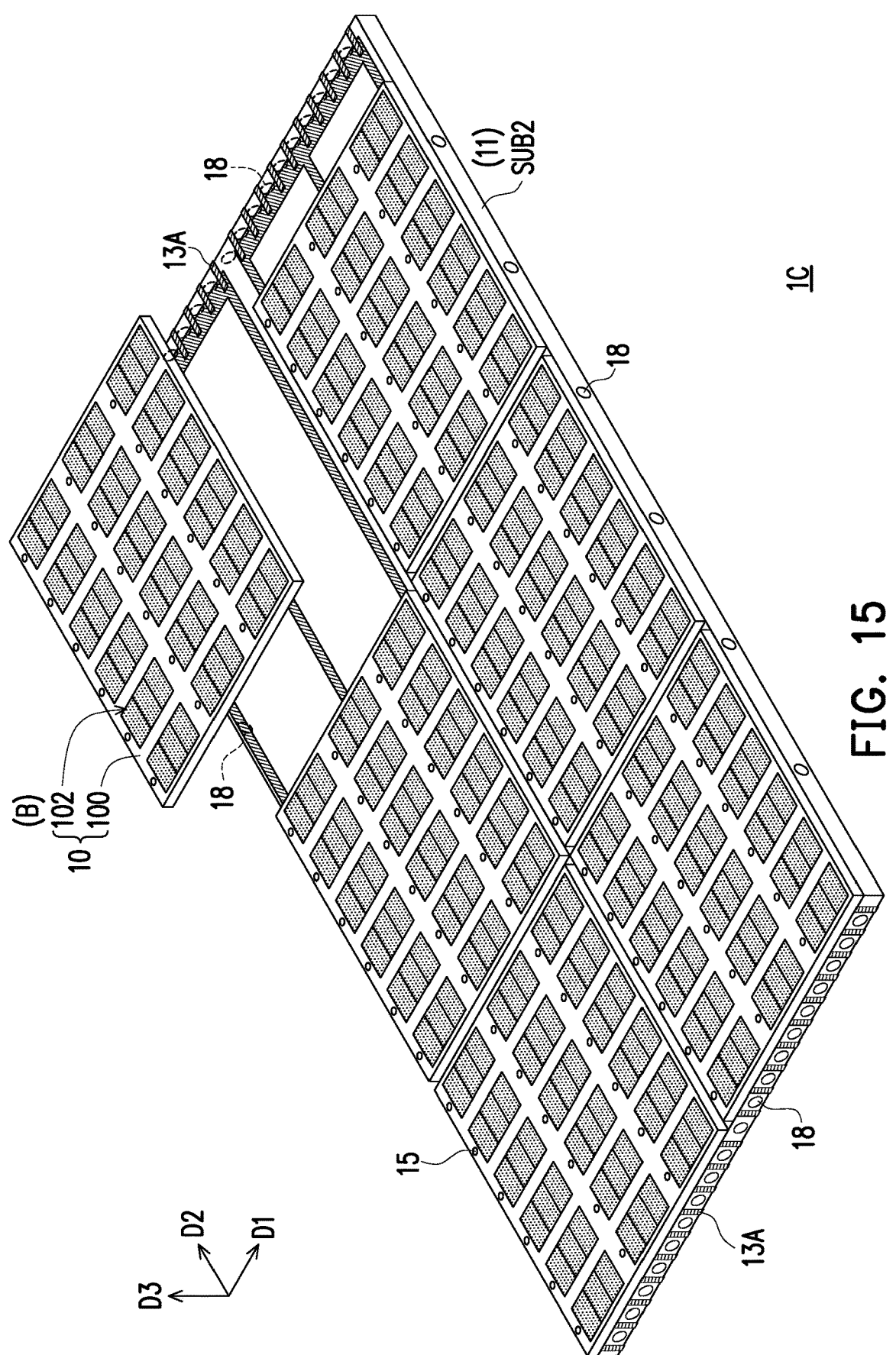
FIG. 15 and FIG. 16 are schematic views of an electronic device during splicing according to some embodiments of the disclosure.
Figure 16:
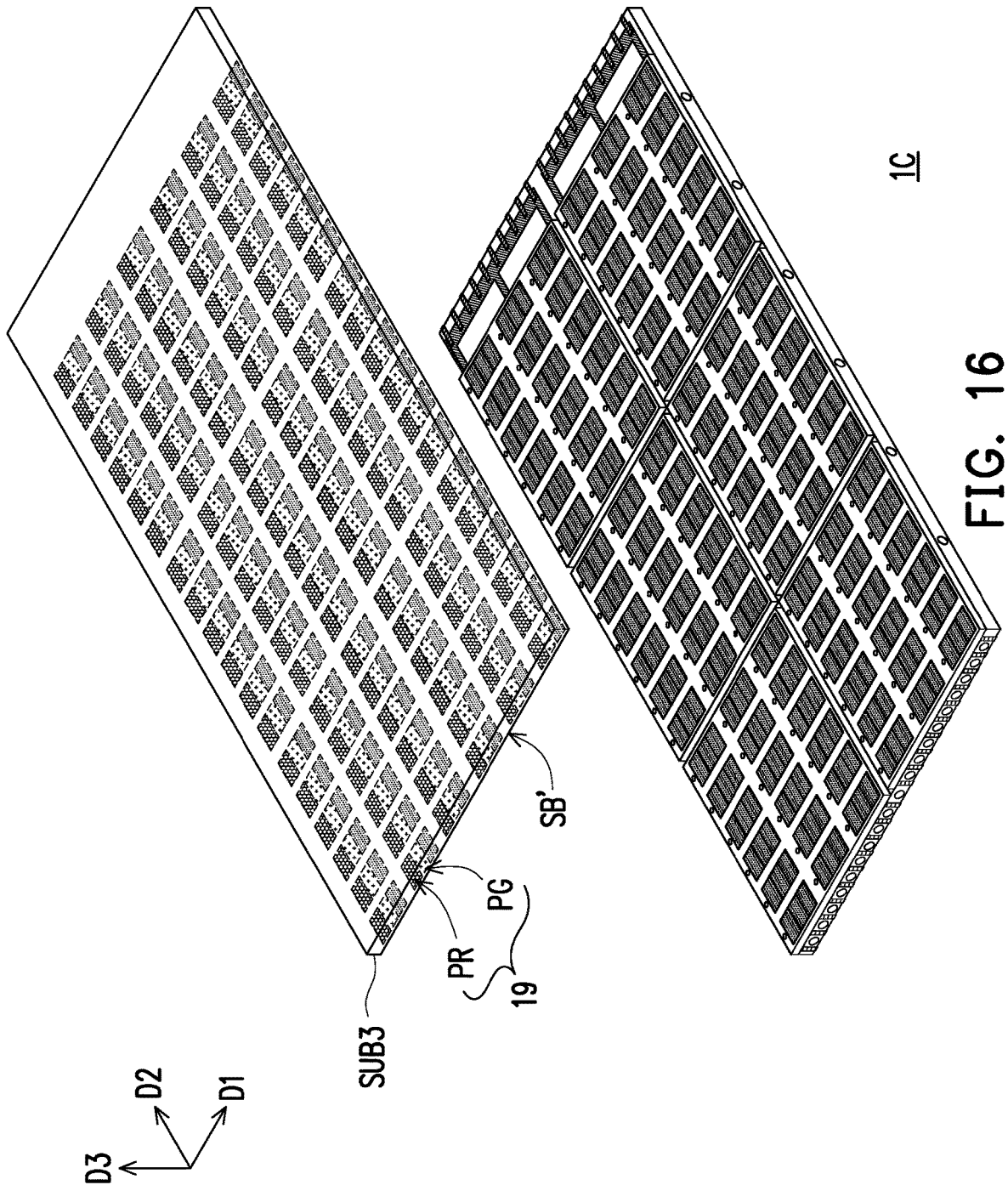

FIG. 15 and FIG. 16 are schematic views of an electronic device during splicing according to some embodiments of the disclosure. Referring to FIG. 15 and FIG. 16, differences between an electronic device 1C and one of the electronic device 1B shown in FIG. 13 and FIG. 14 are as follows. In the electronic device 1C, multiple light-emitting elements 102 include multiple blue light-emitting elements B. In addition, the electronic device 1C also includes a third substrate SUB3 and a light conversion layer 19.

The third substrate SUB3 is disposed correspondingly to multiple light-emitting boards 10. The third substrate SUB3 may include a rigid substrate or a flexible substrate. For example, a material of the third substrate SUB3 may include glass, polyimide, polyethylene terephthalate, polycarbonate or a combination of the above, but not limited thereto.

The light conversion layer 19 is disposed on a surface SB' (a lower surface of the third substrate SUB3) of the third substrate SUB3 near multiple light-emitting boards 10. In other words, the light conversion layer 19 is disposed between a surface (an upper surface of the third substrate SUB3) of the third substrate SUB3 away from the light-emitting boards 10 and the light-emitting boards 10. The light conversion layer 19 may include, for example, fluorescence, phosphor, quantum dots, other suitable materials, or a combination of the above, but not limited thereto. According to some embodiments, the light conversion layer 19 may include multiple red light conversion patterns PR converting blue light emitted by the blue light-emitting elements B into red light, and multiple green light conversion pattern PG converting the blue light emitted by the blue light-emitting elements B into green light, but not limited thereto. According to some embodiments, the light conversion layer 19 may be, for example, a color filter layer. The color filter layer includes a red filter pattern PR and a green filter pattern PG, but not limited thereto.

According to some embodiments, an area of the third substrate SUB3 may be equal to the area of the second circuit board 11. Through disposing the third substrate SUB3 having the light conversion layer 19 correspondingly to multiple light-emitting boards 10, visibility of splicing seams may be reduced and an overall visual effect may be improved.

According to some embodiments, although not shown, the electronic device 1C may also include multiple second circuit boards 11, and second circuit boards 11 may be spliced together through multiple connectors 18 to form a larger size display. In addition, although not shown, multiple second circuit boards 11 spliced together may be supported by a metal bracket; alternatively, the second circuit boards 11 may be supported by a larger carrier board, and an area of the carrier board, for example, is greater than or equal to a sum of areas of the second circuit boards 11.

In summary, according to the embodiments of the disclosure, it may be easy to splice by disposing multiple light-emitting boards on the second circuit board to form a larger size display. In addition, disposing the light-emitting boards adjacent to each other helps to reduce a size of gaps between the light-emitting boards to facilitate realization of visually seamless. Furthermore, disposing the control board below the second circuit board helps to reduce a border of the second circuit board to facilitate realization of high resolution or narrow border design.

The embodiments are intended only to illustrate the technical solutions of the disclosure and not to limit them. Although the disclosure is described in detail with reference to the foregoing embodiments, it will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

Although the embodiments of the disclosure and their advantages have been disclosed above, it should be understood that any person with ordinary knowledge in the art, without departing from the spirit and scope of the disclosure, make variations, substitutions and embellishments, and the features of each embodiment may be intermixed and substituted at will to form other new embodiments.

In addition, the scope of protection of this disclosure is not limited to the process, machine, manufacture, material composition, device, method and procedure in the particular embodiment described in the specification, and any person with ordinary knowledge in the art can understand from this disclosure that the process, machine, manufacture, material composition, device, method and procedure currently or in the future developed can be used in accordance with this disclosure as long as they can perform substantially the same function or obtain substantially the same result in the embodiment described herein. Therefore, the scope of protection of this disclosure includes the above process, machine, manufacture, material composition, device, method and procedure. In addition, each claim constitutes an individual embodiment, and the scope of protection of this disclosure includes the combination of the individual claims and embodiments. The scope of protection of this disclosure shall be subject to the definition of the accompanying claims.

What is claimed is:

1. An electronic device comprising:
a plurality of light-emitting boards, wherein each of the light-emitting boards comprises a first circuit board and a plurality of light-emitting elements, the light-emitting elements are disposed on the first circuit board and are electrically connected to the first circuit board;
a second circuit board, wherein the light-emitting boards are disposed on the second circuit board and are electrically connected to the second circuit board;
a control board disposed on the second circuit board; and
a plurality of conductive members disposed on at least one side of the second circuit board, wherein the control board is electrically connected to the second circuit board through the conductive members,
wherein the first circuit board comprises a first substrate and a first circuit, the first circuit is located between the first substrate and the light-emitting elements, the first substrate is located between the first circuit and the second circuit board, and the light-emitting elements are electrically connected to the first circuit,
wherein the second circuit board comprises a second substrate and a second circuit, the second circuit is located between the first substrate and the second substrate, and the control board and the second circuit are respectively disposed on opposite sides of the second substrate and are electrically connected through the conductive members,
wherein the first substrate is directly above on a top surface of the second substrate,
wherein one of the plurality of light-emitting elements partially overlaps one of the plurality of conductive members,
wherein the electronic device comprises a plurality of second circuit boards, and the electronic device further comprises:

a plurality of connectors disposed on at least two sides of the second circuit boards, wherein the second circuit boards are spliced together through the connectors,
wherein a portion of the plurality of conductive members disposed on the at least two sides of the second circuit boards, and the plurality of connectors and the portion of the plurality of conductive members are disposed alternately on the at least two sides of the second circuit board.

2. The electronic device according to claim 1 further comprising:
a plurality of conductive pillars penetrating the first substrate, and the first circuit is electrically connected to the second circuit through the conductive pillars.

3. The electronic device according to claim 1, wherein the conductive members are electrically connected to the control board through an anisotropic conductive film.

4. The electronic device according to claim 1, wherein the connectors are magnetic bumps.

5. The electronic device according to claim 1, wherein the light-emitting elements comprise a plurality of red light-emitting elements, a plurality of green light-emitting elements, and a plurality of blue light-emitting elements.

6. The electronic device according to claim 1, wherein the light-emitting elements comprise a plurality of blue light-emitting elements, and the electronic device further comprises:
a third substrate corresponding to the light-emitting boards; and
a light conversion layer disposed on a surface of the third substrate near the light-emitting boards.

7. The electronic device according to claim 1 further comprising:
a bonding layer, wherein the light-emitting boards are disposed on the second circuit board through the bonding layer.

8. The electronic device according to claim 1, wherein at least one of the conductive members overlaps with at least one of the light-emitting boards in a thickness direction of the electronic device.

9. An electronic device comprising:
a plurality of light-emitting boards, wherein each of the light-emitting boards comprises a first circuit board and a plurality of light-emitting elements, the light-emitting elements are disposed on the first circuit board and are electrically connected to the first circuit board;
a second circuit board, wherein the light-emitting boards are disposed on the second circuit board and are electrically connected to the second circuit board;
a control board disposed on the second circuit board; and
a plurality of conductive members penetrating the second circuit board, wherein the control board is electrically connected to the second circuit board through the conductive members,
wherein the first circuit board comprises a first substrate and a first circuit, the first circuit is located between the first substrate and the light-emitting elements, the first substrate is located between the first circuit and the second circuit board, and the light-emitting elements are electrically connected to the first circuit,
wherein the second circuit board comprises a second substrate and a second circuit, the second circuit is located between the first substrate and the second substrate, and the control board and the second circuit are respectively disposed on opposite sides of the second substrate and are electrically connected through the conductive members, wherein the first substrate is directly above on a top surface of the second substrate, wherein one of the plurality of light-emitting elements partially overlaps one of the plurality of conductive members, wherein the electronic device comprises a plurality of the second circuit boards, and the electronic device further comprises:

a plurality of connectors disposed on at least two sides of the second circuit boards, wherein the second circuit boards are spliced together through the connectors, wherein a portion of the plurality of conductive members disposed on the at least two sides of the second circuit boards, and the plurality of connectors and the portion of the plurality of conductive members are disposed alternately on the at least two sides of the second circuit board.

10. The electronic device according to claim 9, wherein the conductive members are electrically connected to the control board through an anisotropic conductive film.

11. The electronic device according to claim 9, wherein the connectors are magnetic bumps.

12. The electronic device according to claim 9 further comprising:

a plurality of conductive pillars penetrating the first substrate, and the first circuit is electrically connected to the second circuit through the conductive pillars.

13. The electronic device according to claim 9, wherein the light-emitting elements comprise a plurality of red light-emitting elements, a plurality of green light-emitting elements, and a plurality of blue light-emitting elements.

14. The electronic device according to claim 9, wherein the light-emitting elements comprise a plurality of blue light-emitting elements, and the electronic device further comprises:

a third substrate corresponding to the light-emitting boards; and a light conversion layer disposed on a surface of the third substrate near the light-emitting boards.

15. The electronic device according to claim 9 further comprising:

a bonding layer, wherein the light-emitting boards are disposed on the second circuit board through the bonding layer.

16. The electronic device according to claim 9, wherein at least one of the conductive members overlaps with at least one of the light-emitting boards in a thickness direction of the electronic device.

* * * * *